(12) United States Patent  
Mazumder (10) Patent No.: US 8,796,728 B2  
(45) Date of Patent: Aug. 5, 2014

(54) PHOTONICALLY-ACTIVATED SINGLE-BIAS FAST-SWITCHING INTEGRATED THYRISTOR

(75) Inventor: Sudip K. Mazumder, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/281,207

(22) Filed: Oct. 25, 2011

(65) Prior Publication Data

US 2012/0098029 A1   Apr. 26, 2012

Related U.S. Application Data

(60) Provisional application No. 61/406,340, filed on Oct. 25, 2010.

(51) Int. Cl.  
*H01L 27/06* (2006.01)

(52) U.S. Cl.  
USPC .......................................... 257/113; 257/115

(58) Field of Classification Search  
USPC .......... 257/115, E27.011; 327/440–442, 470, 327/471, 474, 475; 250/214 SW, 214 LS, 250/214.1, 214 LA, 214 AL, 214 C, 214 AG, 250/227.14  
See application file for complete search history.

(56) References Cited

U.S. PATENT DOCUMENTS

| | | | |
|---|---|---|---|
| 4,117,505 A * | 9/1978 | Nakata | 257/108 |
| 8,183,512 B2 | 5/2012 | Mazumder et al. | |
| 2009/0026967 A1* | 1/2009 | Mazumder et al. | 315/159 |
| 2009/0283664 A1* | 11/2009 | Mazumder et al. | 250/214 SW |
| 2010/0283529 A1 | 11/2010 | Zhang et al. | |

OTHER PUBLICATIONS

Wang et al. ("Silicon Carbide Emitter Turn-Off Thyristor"; International Journal of Power Management Electronics, vol. 2008, Accepted Apr. 27, 2008).*

Mazumder ("Optically-activated gate control of power semiconductor device switching dynamics", Power Semiconductor Devices & IC's, 2009. ISPSD 2009. 21st Internati.*

Mukai, Takashi, "Recent Progress in Group-III Nitride Light- Emitting Diodes," *IEEE Journal on Selected Topic in Quantum Electronics*, Mar./Apr. 2002, vol. 8, No. 2.

* cited by examiner

*Primary Examiner* — Asok K Sarkar  
*Assistant Examiner* — Dmitriy Yemelyanov  
(74) *Attorney, Agent, or Firm* — Greer, Burns & Crain Ltd.

(57) ABSTRACT

Preferred embodiments of the invention include a thyristor core that is single biased by a source, such as a power source (or a portion thereof) that is being switched through the thyristors. An optically activated transistor that is preferably a minority carrier device is in series with the thyristor core. The thyristor core has an optically activated gate. The turn-off of the thyristor can be accelerated by the turn-on (conduction state) of a gate switch, which ensures a unity gain turn-off of the core thyristor.

14 Claims, 14 Drawing Sheets

PHOTONICALLY-ACTIVATED SINGLE-BIAS FAST-SWITCHING INTEGRATED THYRISTOR

PRIORITY CLAIM AND REFERENCE TO RELATED APPLICATION

The application claims priority under 35 U.S.C. §119 from prior provisional application Ser. No. 61/406,340, which was filed Oct. 25, 2010.

STATEMENT OF GOVERNMENT INTEREST

This invention was made with Government support under Award No. 0823983 awarded by the National Science Foundation. The Government has certain rights in the invention.

FIELD

A field of the invention is thyristors. Example applications for a thyristor of the invention include in high power conversion.

BACKGROUND

Thyristors can be used in situations where it is necessary to control high voltages and currents with a small bias voltage. Example applications include the switching of power into the electrical grid from new types of power sources, e.g., solar and wind generation devices or systems, and power quality control in the electrical grid using a FACTS (flexible AC transmission system).

Figure 1A:
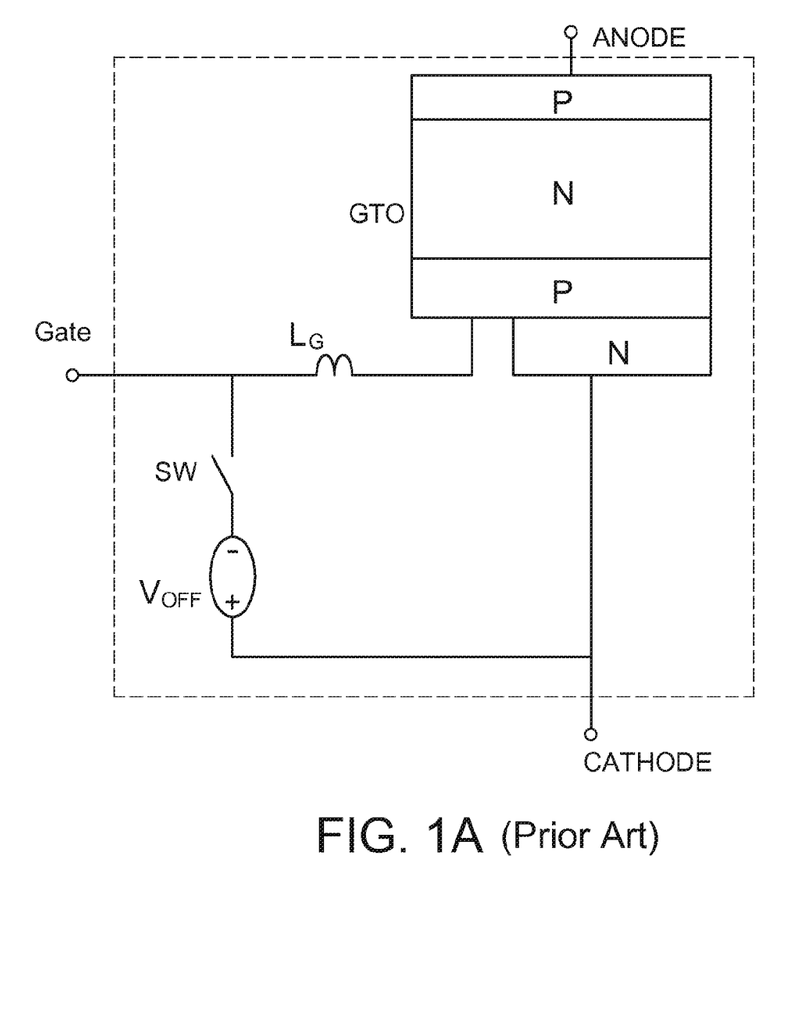
FIGS. 1A-1C show popular known thyristor designs that include multiple low voltage biases.
Figure 1B:
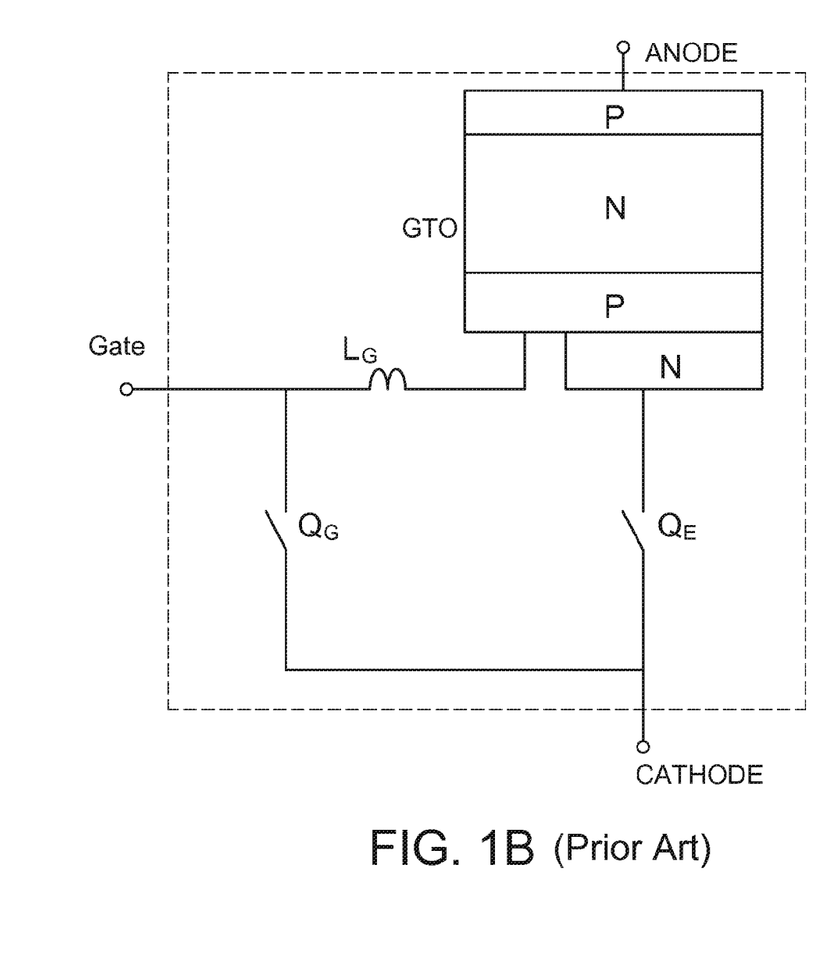
Figure 1C:
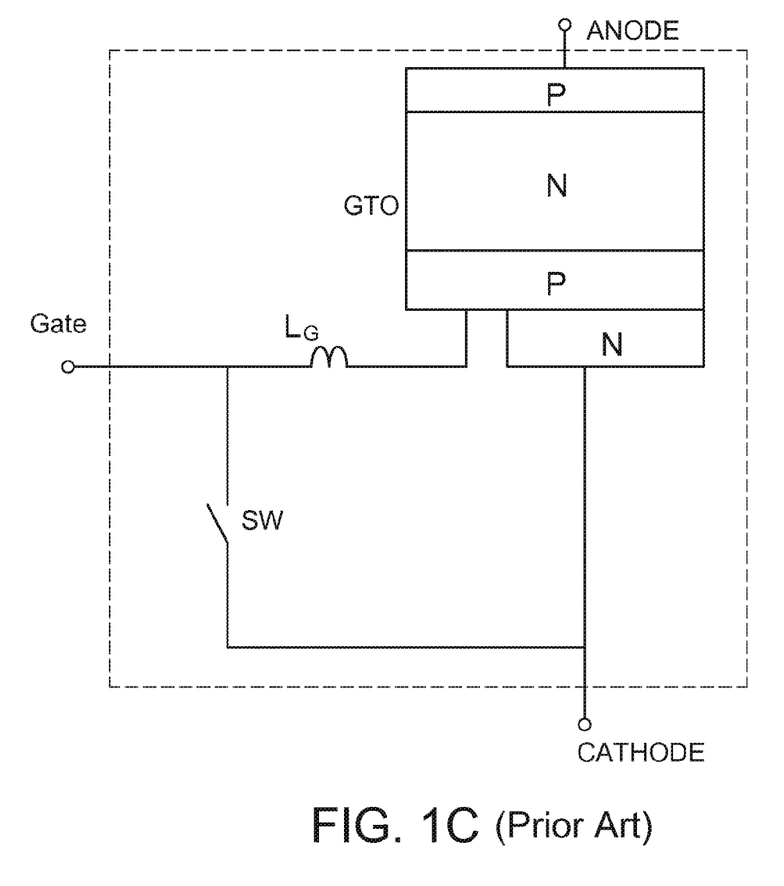

A thyristor includes three p-n junctions. Thyristors are pnpn or npnp devices, and known used devices require more than one bias. The thyristor main bias is for anode-to-cathode power flow and another bias is for the thyristor gate. Additional biases may be required for switches that are auxiliary to the thyristor. FIGS. 1A-1C illustrate known electrically triggered thyristor devices, each of which requires a gate bias and a anode-cathode bias. Additional low voltage bias can be required for the switches. FIG. 1A is an integrated gate-commutated thyristor (IGCT), as commonly used to switch electrical current in industrial equipment. The low voltage applied to the gate-control terminal is used to switch the thyristor on and off. FIG. 1B is an emitter turn-off thyristor (ETO) that is typically implemented in SiC and used in power switching. FIG. 1C is a MOS turn-off transistor, also used in power switching The switches used in the prior art thyristors are parallel MOSFETs. Many parallel MOSFETs are used as a switch because of the high powers switched through the thyristors. The parallel MOSFET arrangement provides fast turn-off. In power conversion, the speed of device switching is an important concern to designers.

The need for multiple low voltage control signals causes design and reliability problems. The low voltage for control is typically less than 10V, whereas the high voltages being switched are on the order of kilovolts, e.g., 20 kV. Isolation of the low voltage control and high voltage signals can be problematic.

One method to isolate the circuits is to use an optical interface to receive the control signals. The optical control signals are still converted, such as by a photodetector to the low control voltage level for bias. The optical delivery of the control signal can effectively isolate control circuitry from the high power signals, but photodetectors introduce delays and signal-to-noise issues. The use of a photodetector typically also makes the control a binary operation. The control signal is supplied to the gate or base of the power semiconductor device via the photodetector to turn the power device on and off.

An example of a photodetector controlled device is described in Zhang et al., U.S. Patent Application No. US 2010/0283529. The thyristor disclosed in Zhang et al. can be controlled with an LED and a photodetector as in FIG. 4. However, Zhang's et al. thyristors requires first and second low control voltage biases, $V_1$ and $V_2$ as in FIG. 3. In the FIG. 4 device light applied to an optically triggered driver device, but multiple bias signals are still required.

SUMMARY OF THE INVENTION

Preferred embodiments of the invention include a thyristor core that is single biased by a source, such as a power source (or a portion thereof) that is being switched through the thyristors. An optically activated transistor that is preferably a minority carrier device is in series with the thyristor core. The thyristor core has an optically activated gate. The turn-off of the thyristor can be accelerated by the turn-on (conduction state) of a gate switch, which ensures a unity gain turn-off of the core thyristor.

DETAILED DESCRIPTION OF THE PREFERRED EMBODIMENTS

Preferred embodiments of the invention include a thyristor core that is single biased by a source, such as a power source (or a portion thereof) that is being switched through the thyristors. An optically activated transistor that is preferably a minority carrier device is in series with the thyristor core. The thyristor core has an optically activated gate. The turn-off of the thyristor can be accelerated by the turn-on (conduction state) of a gate switch, which ensures a unity gain turn-off of the core thyristor.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Figure 2:
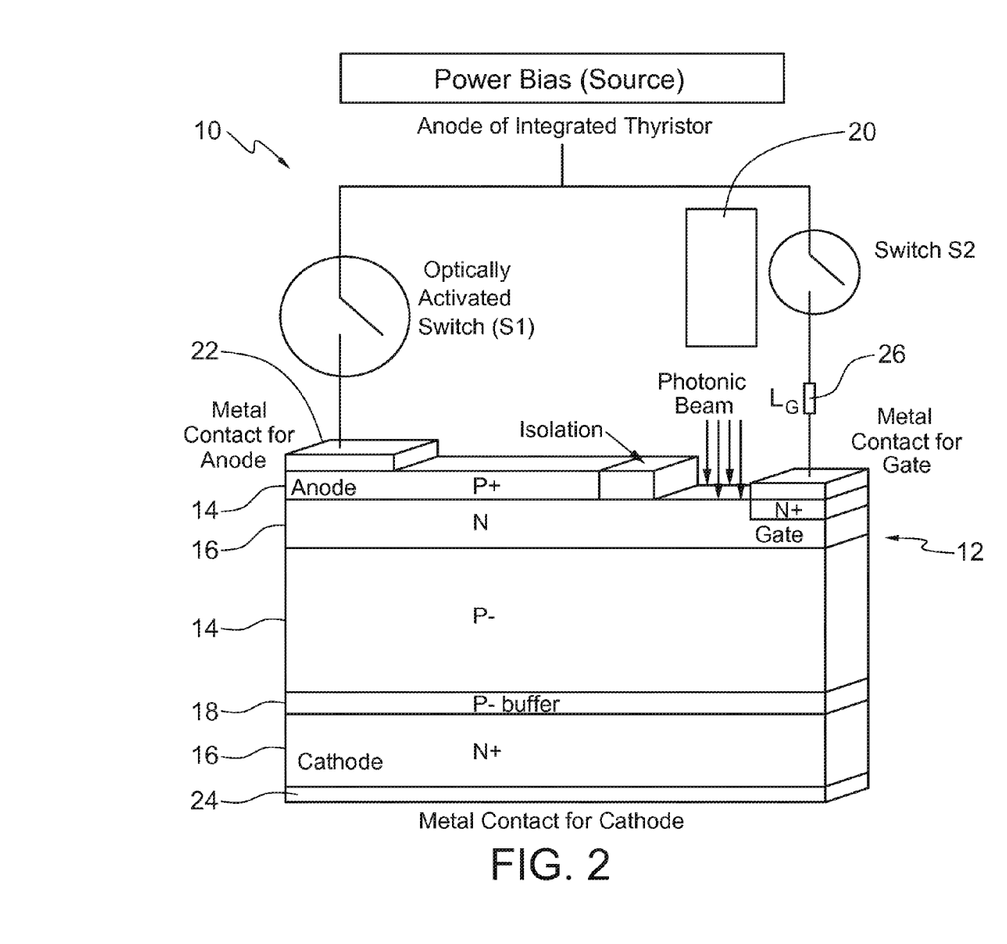
FIG. 2 is a schematic perspective view of a preferred embodiment thyristor system including optically controlled thyristor of the invention.

FIG. 2 shows a thyristor system 10 and optically controlled thyristor 12 of the invention. An optical integrated thyristor structure comprises a core thyristor 12 with monolithically integrated or hybrid integrated switches Si and S2 and a laser 20 for device turn-on and off. The thyristor 12 in FIG. 2 is pnpn but can also be npnp, and in either case the current flow is from anode to cathode. The p type regions 14 and n-type regions 16 form the three n-p junctions that are characteristic of a thyristor. A thin optional buffer layer 18 can be used to smooth electrical field of the power device thyristor 12. The thyristor 12 can be implemented with narrow or wide bandgap materials or a combination. The material system can be homogeneous or heterogeneous. For example, in one embodiment, all the devices including the thyristor 12 and switches S1 and S2 can be made of Si; while in another embodiment, the thyristor 12 can be made of SiC or GaN while switches Sl and S2 can be made of narrow-bandgap material, such as SiC and GaN, or the thyristor 12 and switches can be made of the same type of material. In preferred embodiments, the switches Si and S2 are monolithically integrated with the thyristor 12, and in other embodiments chip bonding permits use of switches fabricated in a different material from the thyristor. An isolation region 27 is optional as the beam from the laser 20 can be well-collimated. It is noted that performance can be increased in terms of switching speed with high power lasers, and the invention is not limited to semiconductor lasers. The laser can be fixed intensity and/or wavelength, or the intensity and wavelength can be varied. Variation of the intensity and wavelength can control the operation of the thyristor in a manner that is different than if the gate is biased electrically. Specifically, through varying the optical intensity of the thyristor 12, the switching onset delay can be dynamically varied. Also, by varying the optical intensity of the switch Sl, the switching onset delay and switching dynamics can be dynamically varied.

A core region of the thyristor 12 is considered the conduction path from an anode contact 22 to a cathode contact 24. An inductor 26 can be used to provide a desired gate impedance. In application of the FIG. 2 device, the only power bias is from a source, e.g., a power source such as a solar power source, a windfarm source, etc., and no separate electrical bias is required for the switch Si (or the switch S2).

In the illustrated embodiment, the switch S1 is optically activated and the switch S2 is either electrically or optically activated. When the switch S2 is electrically triggered, it is self-triggered without any external bias. In this case the switch. S2 turns on (conducts) when the switch S1 turns off (stops conducting). The switches S1 and S2 can be responsive to a same or different wavelength(s) of radiation as the thyristor, which is controlled by a photonic beam such as from a laser 20 that directly irradiates the thyristor material. The thicknesses of the layers are determined primarily with reference to the voltage and current demands that will be placed upon the thyristor, and can be determined by artisans.

Specifically, when light of an appropriate wavelength ($W_1$) and intensity ($I_1$) shines on the N-base region of the pnpn thyristor (for npnp thyristor the base region would be the P-base region), and light of wavelength ($W_1$ or $W_2$) and intensity (11 or 12) shines on the base region of the optically gated transistor optical switch S1, the thyristor conducts current from anode to cathode. Irradiation in n-base (in the npnp) or p-base (in the pnpn) region create electron-hole pairs. In the case of the p-base region, the chances of positive carriers surviving is higher where chances of negative carriers are much lower due to recombination in the the p-base region with the opposite being true with the n-base region. Conduction is achieved without need for any other external bias other than the power bias, which is applied across the anode and cathode. The photonic activation of the series switch S1 and the thyristor 12 provides immunity against electromagnetic interference, enhanced reliability due to a single bias, reduced delay due to direct photogeneration, and enhanced isolation between the thyristor-based power stage and a low-voltage control stage. A low-voltage control stage is typically on a separate hardware that creates the (optical) control signal for the power stage thyristor and triggering devices. Importantly, compared to the FIG. 1A device, the decoupling of the gate driver pulses from the output of the device produces reduces complexity, improves performance, and causes less electronic interference in the system.

Turn-off is achieved when irradiation of the base region and switch S1 is stopped. The switch S1 is a minority carrier device in the invention, such as a bipolar junction transistor. The present inventor has recognized that the slower turn-off speed of the bipolar junction transistor is not a hurdle with the present designs and can still provide a high speed operation. The switch S2 turns on a finite time period after the turn-off of the switch S1, and the thyristor also moves toward recombination in a period on the scale during nanoseconds. Once the switch S2 turns on, recombination occurs with a npn transistor in FIG. 2. Preferably, the switch S2 is also optically activated but it can be electrical (e.g. self-gated). This reduces the risk of damage to the switch S2. If only S1 is turned off and the thyristor is not, then, the low-voltage S1 can be damaged or broken down because it would have to block all the high voltage if only the thyristor is turned off and 51 is not. The time period for the switch S2 to turn-on, if short enough, will normally prevent this occurrence. However, optical triggering of S2 helps to insure that this problem will not occur. When the thyristor 12 is conducting it carries at least part of the power from a source. The thyristor 12 can be part of a parallel arrangement of many thyristors, each of which would then carry part of source current from the source to the load, which is connected to the cathode. Similarly, the thyristor and switches can be cascaded or connected in series.

Advantageously, and unlike the conventional thyristors in FIGS. 1A-1C, the turn-off of thyristor 12 can be accelerated by the turn-on (conduction state) of the switch S2, which ensures a unity gain turn-off of the core thyristor 12. Switch S2 can be electrically self-triggered (without external bias as in the electrical ETO of FIG. 1A) or unlike the electrical ETO of FIG. IA can be optically triggered using light of wavelength ($W_1$ or $W_2$ or $W_3$) and intensity ($I_1$ or $I_2$ or $I_3$).

Figure 3A:
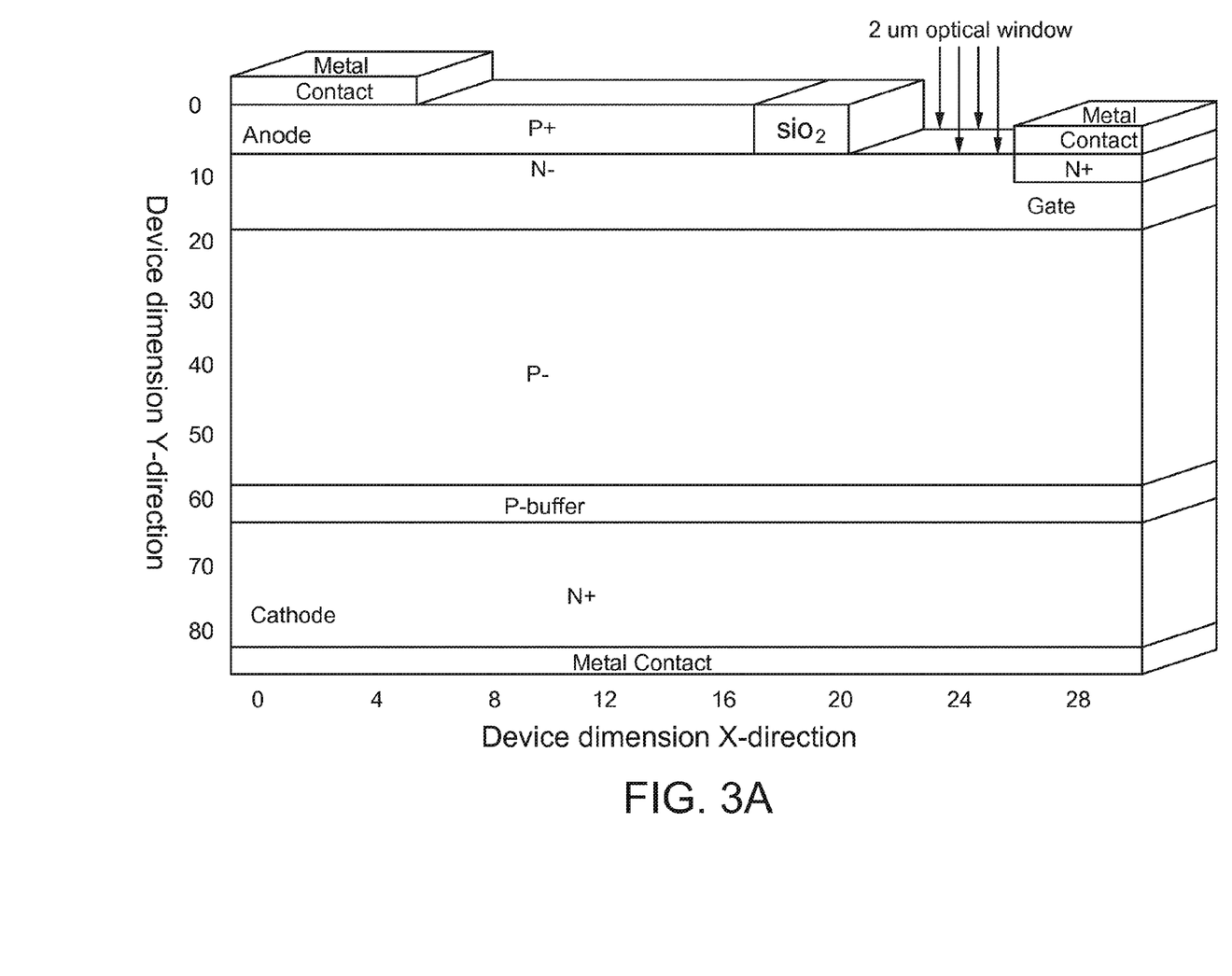
FIG. 3A shows dimensions for a thyristor device in accordance with FIG. 2 that was simulated and FIG. 3B shows a schematic circuit diagram of the device simulated.
Figure 3B:
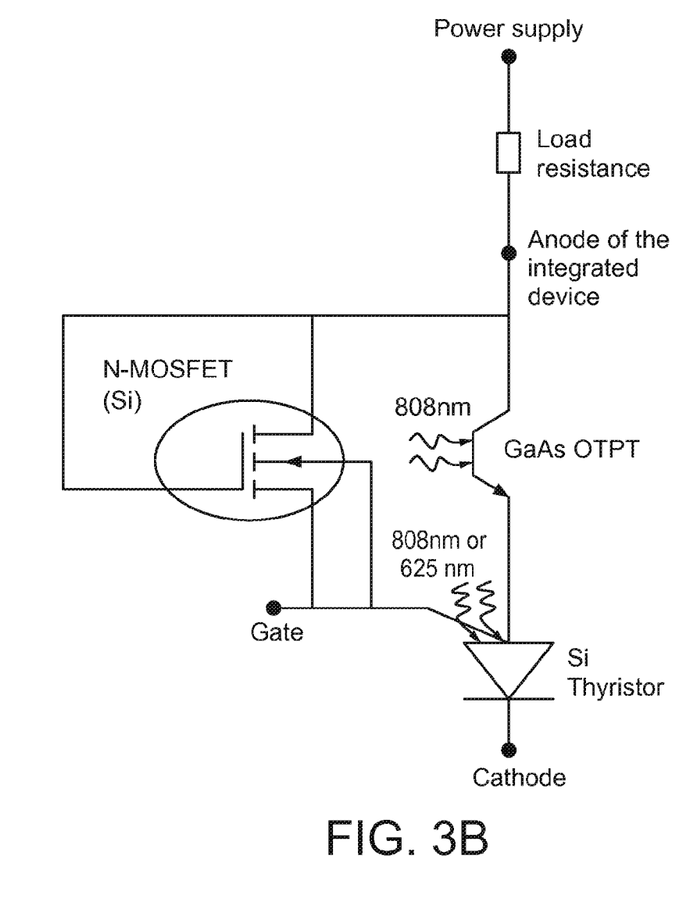

A device in accordance with the embodiment of FIG. 2 has been simulated and the simulations via ATLAS in Mixed-Mode show superior operation. FIG. 3A shows dimensions for the device simulated and FIG. 3B and schematic circuit diagram of the device simulated. The optical thyristor was simulated using Si and SiC. The simulation data was obtained for Si, which provides a cheaper fabrication. In the simulations, switch S2 was N-MOSFET (Si) connected to the gate of the core thyristor, has a breakdown voltage of 150 V and a threshold voltage of 2.5 V. The switch S1 in series with the core thyristor was simulated as a GaAs optically isolated transistor having breakdown voltage of 160 V. The integrated thyristor is turned on by allowing light to fall on both the gate of the core thyristor and the base of the S2 switch. The turn-off is accomplished by turning off the optical beam. Subsequently, the N-MOSFET device S2 (connected to the gate of the core thyristor) turns on, allowing the minority carriers in the core thyristor to recombine at a faster rate.

Figure 4:
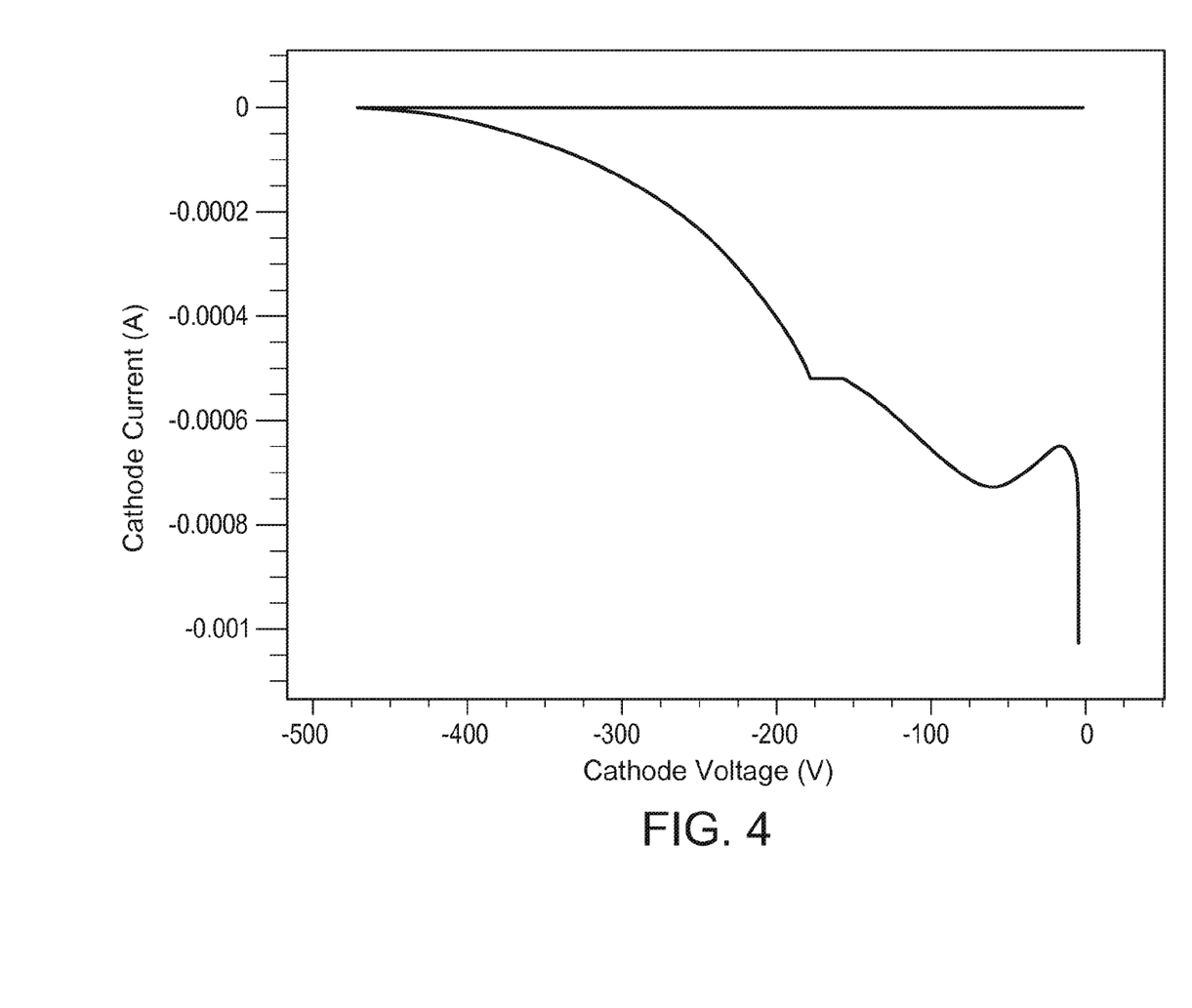
FIG. 4 shows the forward-blocking capability of the simulated core thyristor structure.

FIG. 4 shows the forward-blocking capability of the simulated core thyristor structure. The results show that the half-cell core thyristor structure can block up to 500V in the forward conducting mode. The wavelength of the optical beam activating the core thyristor structure is set at 808 nm or 625 nm while the wavelength of the GaAs optically isolated transistor is set at 808 nm. The wavelength 808 nm was chosen to investigate the performance of the integrated thyristor using a single (but dual channel) optical beam of wavelength that can be used to excite both the core thyristor and the optically isolated transistor. The wavelength of 625 nm for the core thyristor's optical beam was chosen to explore the impact of reduced penetration depth while the transistor beam stayed at 808 nm.

Figure 5:
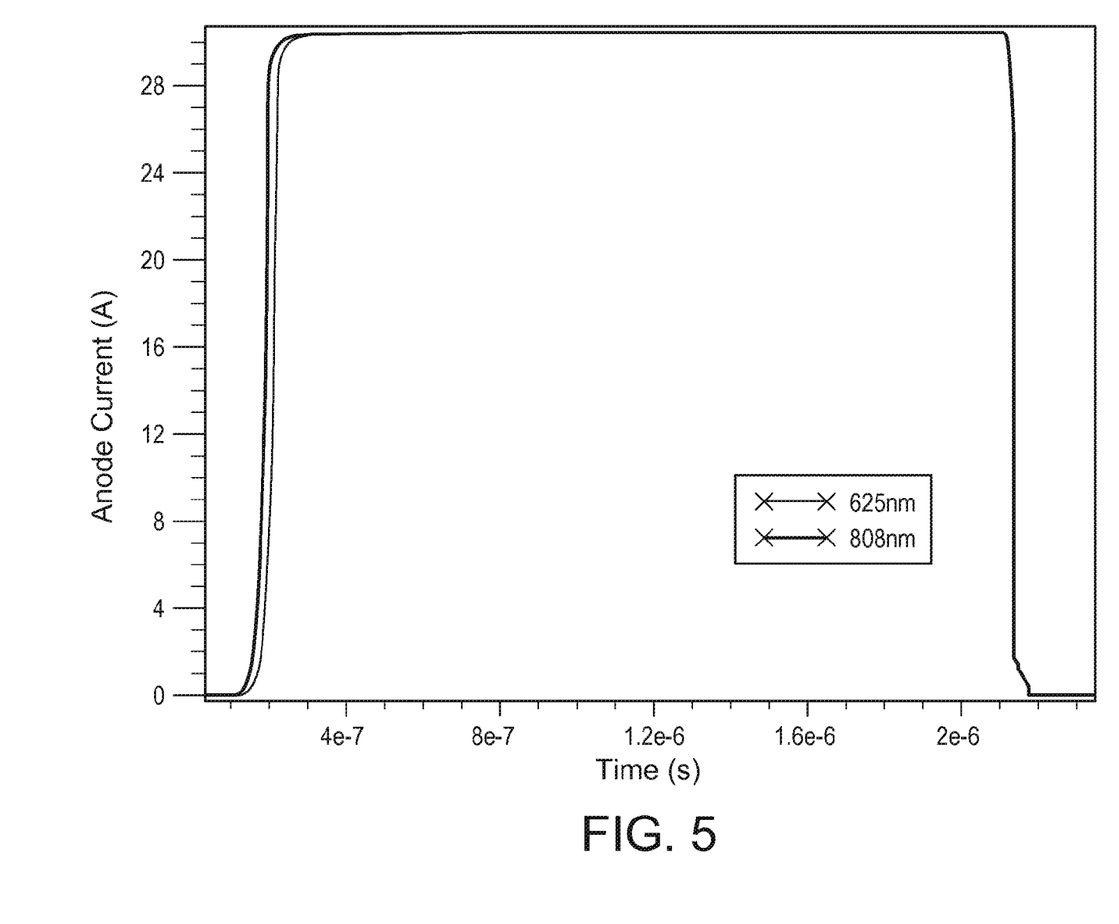
FIG. 5 illustrates the rise time and turn-on delay of the integrated simulated thyristor when core thyristor and optically isolated transistor are optically excited with 808 nm and 625nm wavelengths, respectively. It is noted that, these wavelengths can be lower.

FIG. 5 illustrates the rise time and turn-on delay of the integrated simulated thyristor when core thyristor and optically isolated transistor are optically excited with 808 nm and 625 nm wavelengths, respectively. The intensity of the optical beam for the core thyristor and the optically isolated transistor are 200 mW and 2 W, respectively. The results show the device current of more than 25 A at 808 nm and 625 nm. Rise time and turn-on delay of the integrated thyristor at 808 nm is better than that at 625 nm. This is due to increased penetration depth using 808 nm, beam, as photogeneration rates with the 808 nm beam were determined to be substantially higher at a deeper depth with the 808 nm beam.

Figure 6:
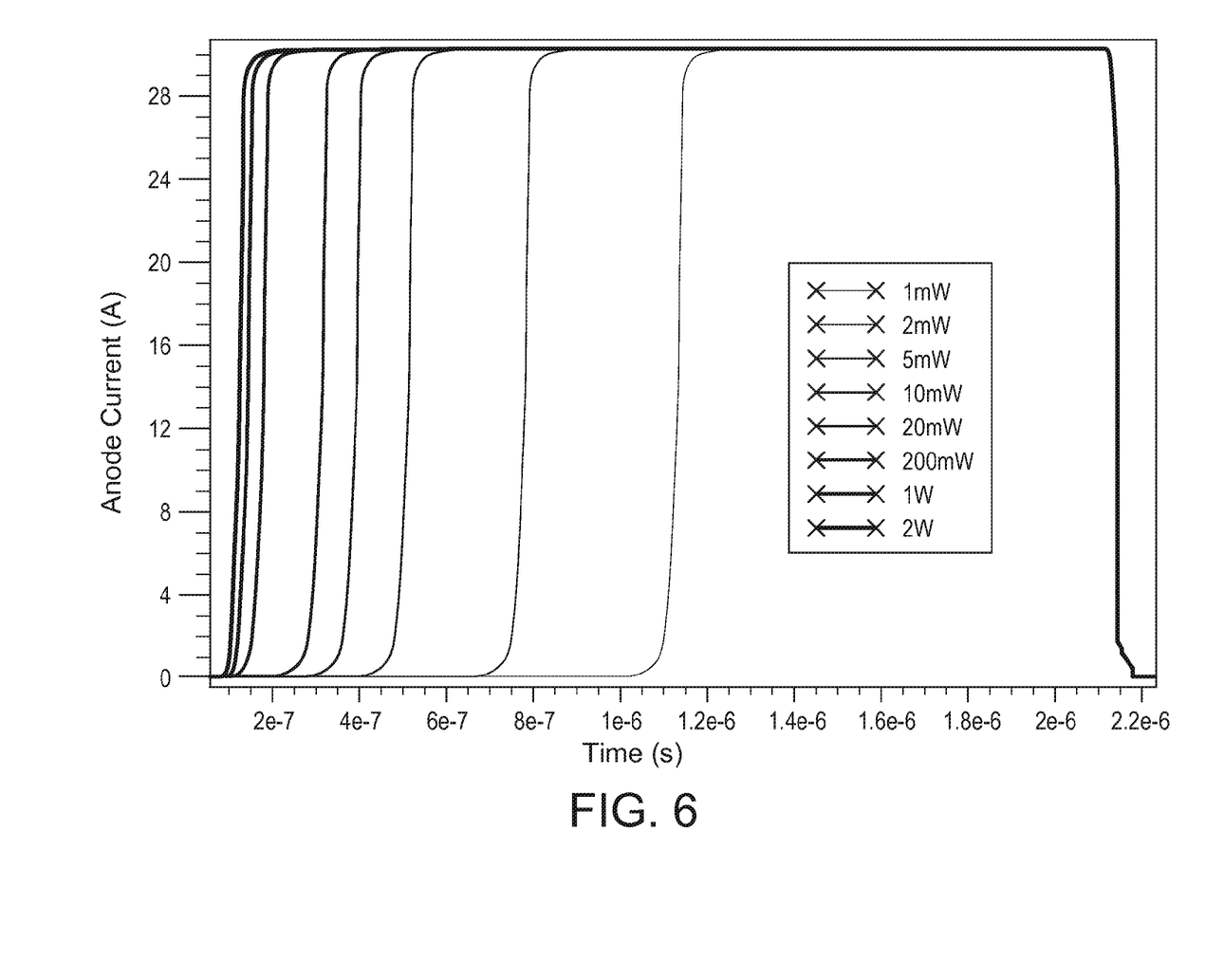
FIG. 6 shows a comparison of rise time of the integrated thyristor when it is activated with an optical beam of wavelength of 808 nm at different powers ranging from 1 mW (right side) to 2 W (left side)

FIG. 6 shows a comparison of rise time of the integrated thyristor when it is activated with an optical beam of wavelength of 808 nm at different powers ranging from 1mW (right side) to 2W (left side), while the intensity and wavelength of the optically isolated transistor (S1) is kept at 2 W and 808 nm. This illustrates the improvement in rise time of the integrated thyristor with varying intensity of the optical beam at a wavelength of 808 nm. It is readily apparent that the speed of the device is improved with the higher power beams subjected to the gate layer.

Figure 7A:
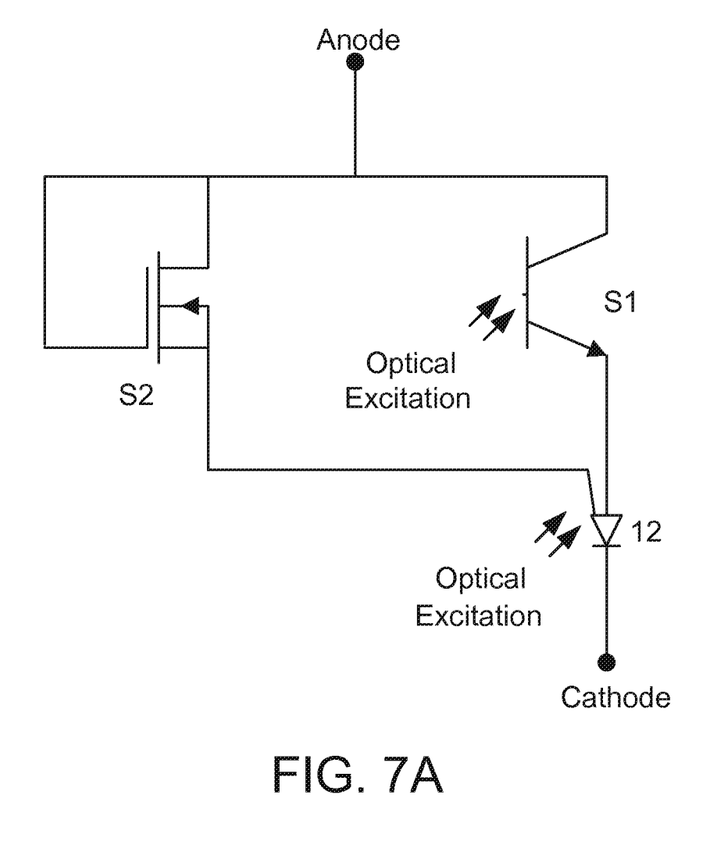
FIGS. 7A-7C illustrate additional anode switched preferred embodiments of the invention.
Figure 7B:
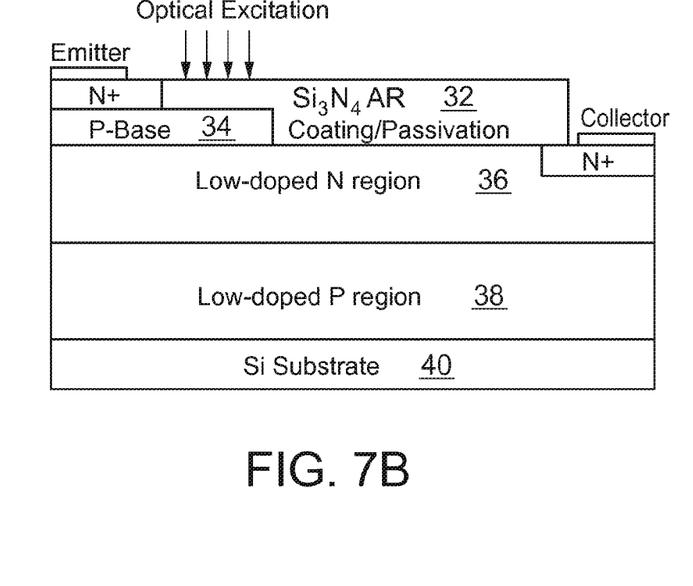
Figure 7C:
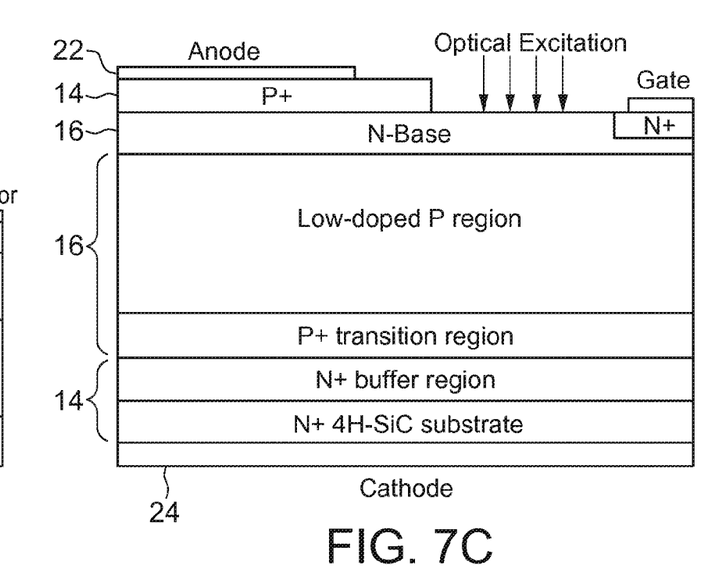

The device of FIG. 2 can be viewed as a modification of the FIG. 1A device, and results in the decoupling of the gate driver pulses from the device output. The invention can also be applied to modify the devices of FIGS. 1B and 1C, as will be apparent from the discussion of the following additional embodiments. FIGS. 7A-7C concern an anode switched embodiment. FIG. 7A shows the basic schematic circuit diagram and FIGS. 7B and 7C are example specific embodiments of the bipolar optically activated switch S1 and the thyristor 12. Like elements in FIGS. 7A-7C are labelled with reference numbers from FIG. 2 for corresponding elements. FIG. 7B illustrates a specific embodiment realized in a silicon and FIG. 7C illustrates a specific embodiment suitable for wide bandgap materials, e.g. SiC or GaN. FIGS. 7B and 7C assume a hybrid arrangement, with the switch S1 of FIG. 7B being in silicon and the thyristor being implemented in SiC. FIG. 7C shows and additional P+ transistion layer as part of the middle p type material, which also aids smooth the electrical field like the buffer layer region that is also shown and was included in FIG. 2.

The bipolar transistor switch of FIG. 7B can be one of multiple-stages, as multiple stages permit the use of variable powers and wavelengths. The thyristor 12 can also be one of a parallel set of thyristors or can be a stage in a multiples stages of thyristors, which can be used to spread carriers more evenly. The switch S1 of FIG. 7B is implemented in silicon and includes a passivation layer 32 over a p-base region. 34 and a low-doped n region 36. The device is completed with a low doped p-region and the silicon substrate 40. Optical excitation applied to the base 34 as in FIG. 7A turns the switch on and permits the power source to be connected to the anode of the thyristor via the emitter and collector.

Figure 8A:
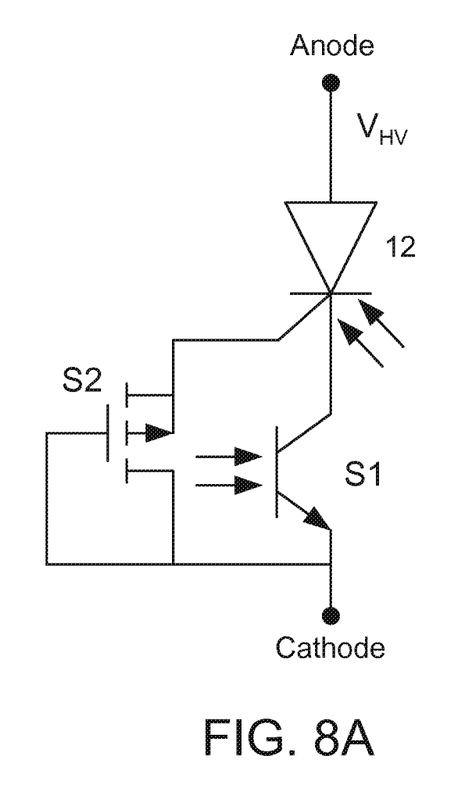
FIGS. 8A-8C illustrate additional cathode switch preferred embodiments of the invention.
Figure 8B:
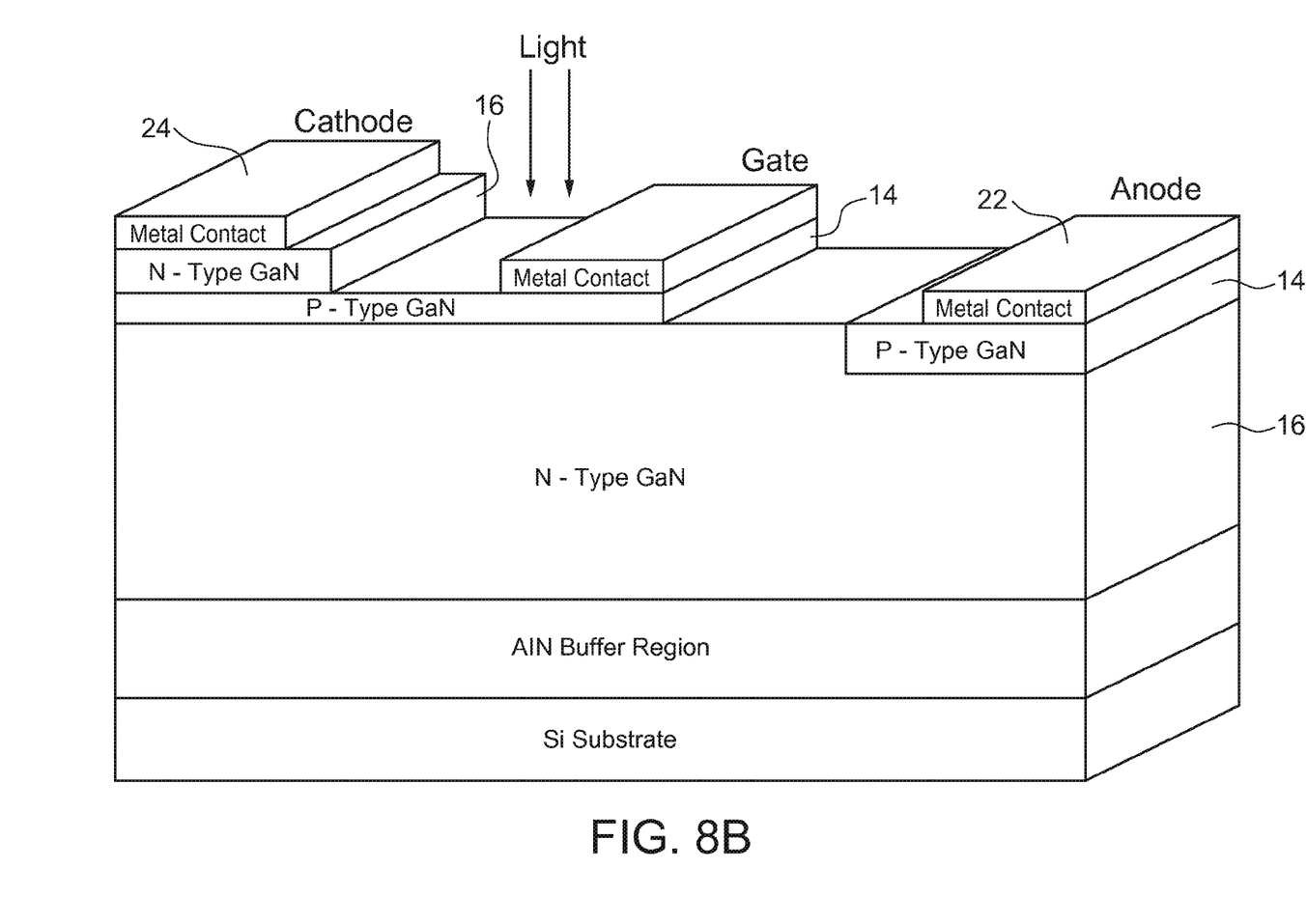
Figure 8C:
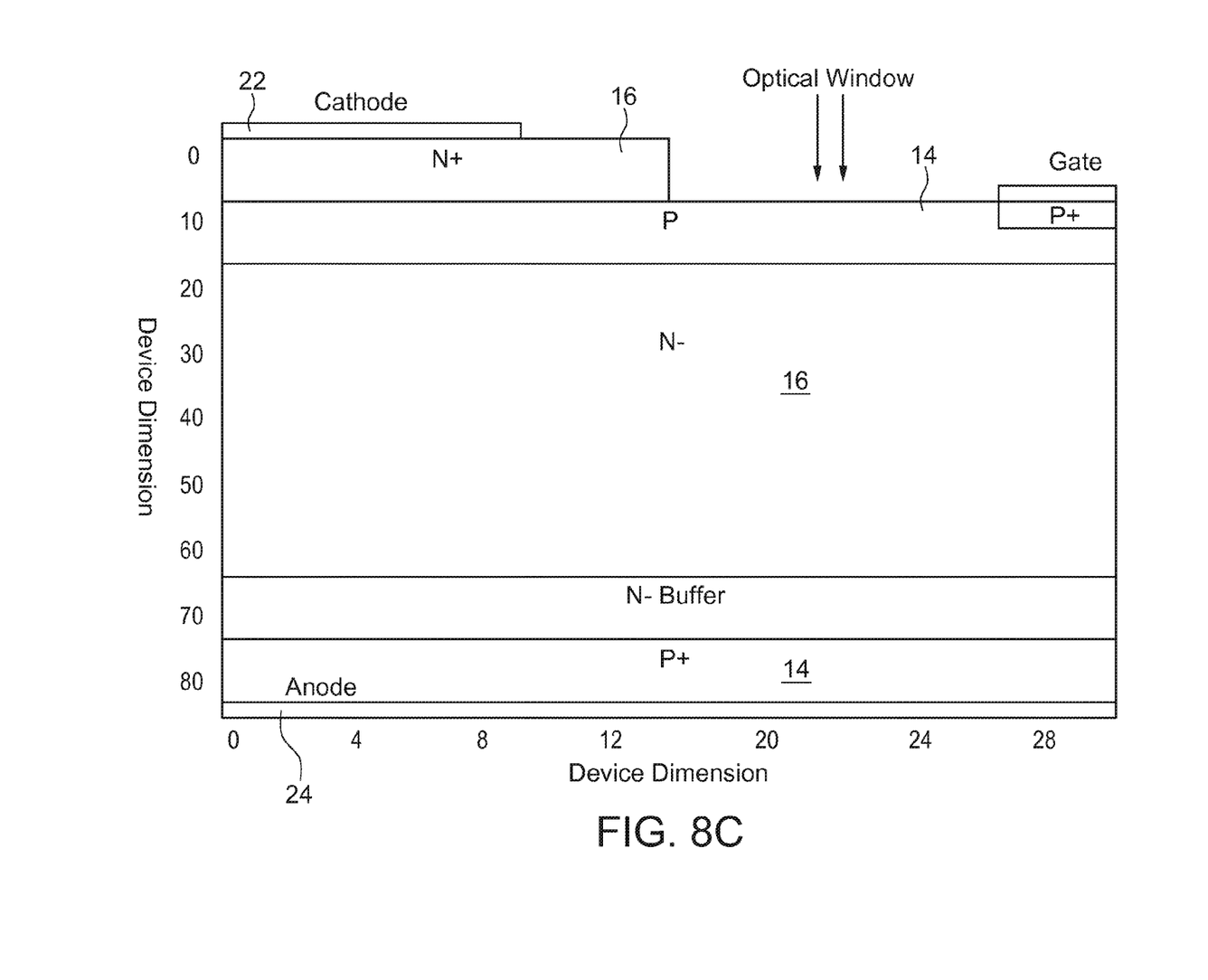

FIG. 8A shows a cathode switched device. The thyristors of FIG. 2 or FIG. 7C can be used with the FIG. 8A as can the switch of FIG. 7B. FIGS. 8B and 8C illustrate additional thyristor variations with FIG. 8B illustrating a Group III-V lateral embodiment and FIG. 8C illustrating an example silicon embodiment. Similar elements are labelled with like reference numbers to previous embodiments while example preferred materials and dimensions are also limited.

Artisans will appreciate that devices of the invention have many applications. Example applications include high power power-electronics systems such as FACTS devices, UPQC (unified power quality conditioner), active filters, motor drives, renewable and alternative energy systems (e.g. wind, photovoltaic, fuel cell, energy storage systems), multilevel converters. Devices of the invention would also be useful for power system fault isolation and/or mitigation switch, and pulsed power applications. Additional applications include fly-by-light (FBL) applications, and other electric ships, combat vehicles etc. requiring EMI immunity, optical isolation.

While specific embodiments of the present invention have been is shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A single bias integrated thyristor, comprising:
an optical thyristor core including three p-n junctions between an anode and cathode;
an optically isolated transistor switched in series with one of said anode and said cathode and being biased by a single power bias source that powers the optically isolated transistor without any separate low voltage bias;
a self or optically triggered gate switch biased by said single power bias source without any separate low voltage bias and connected to said integral optically isolated transistor connecting a load to a gate region to the optical thyristor core, wherein said self or optically triggered gate switch turns on a finite period after said optically isolated transistor turns off to initiate thyristor turn-off and ensure a unity gain turn-off of the thyristor; and
an optically exposed gate region for receiving radiation.

2. The thyristor of claim 1, wherein said self or optically triggered gate switch gate switch comprises a second optically isolated transistor switch.

3. The thyristor of claim 1, wherein said self or optically triggered gate switch gate switch comprises an electrically activated transistor switch.

4. The thyristor of claim 3, wherein said optical thyristor core comprises a pnpn series of layers.

5. The thyristor of claim 3, wherein said optical thyristor core comprises a npnp series of layers.

6. The thyristor of claim 1, further comprising a laser for irradiating said exposed gate region.

7. The thyristor of claim 6, wherein said exposed gate region is an upper surface of a gate layer not including a junction.

8. The thyristor of claim 1, wherein said optically isolated transistor comprises a minority carrier device.

9. The thyristors of claim 8, wherein said optically isolated transistor comprises a bipolar transistor.

10. The thyristor of claim 1, wherein said optically isolated transistor and said optical thyristor core are monolithically integrated.

11. The thyristor of claim 1, wherein said optically isolated transistor and said optical thyristor core are formed of different materials.

12. The thyristor or claim 1, comprising one stage in a multi-stage device.

13. A single bias integrated thyristor, comprising:
- a thyristor core with a pair of monolithically or hybrid integrated switches including an anode or cathode switch and a gate switch, wherein the anode or cathode switch is optically activated and the gate switch is electrically or optically activated;
- a conduction path through the core from an anode contact to a cathode contact;
- an optically exposed region in a layer that forms part of the conduction path, wherein the layer that forms part of the conduction path is electrically associated with the one of a cathode and anode region of the core and also the gate region;
- a laser for irradiating the exposed region with radiation that irradiates the layer in the conduction path with radiation wavelengths selected to bias the anode or cathode switch with sufficient radiation such that no separate electrical bias is required for the anode or cathode switch.

14. The thyristors of claim 12, wherein the gate switch is electrically triggered and lacks any separate electrical bias.

\* \* \* \* \*

UNITED STATES PATENT AND TRADEMARK OFFICE
CERTIFICATE OF CORRECTION

PATENT NO. : 8,796,728 B2  
APPLICATION NO. : 13/281207  
DATED : August 5, 2014  
INVENTOR(S) : Sudip K. Mazumder Page 1 of 1

It is certified that error appears in the above-identified patent and that said Letters Patent is hereby corrected as shown below:

In the Specification:

| | |
|---|---|
| Col. 3, line 6 | Please delete "Si" and insert --S1-- therefor. |
| Col. 3, line 45 | Please delete "Si" and insert --S1-- therefor. |
| Col. 3, line 50 | Between "switch" and "S2", please delete the ".". |
| Col. 4, line 32 | Please delete "51" and insert --S1-- therefor. |
| Col. 5, line 54 | After "shows", please delete "and" and insert --an-- therefor. |
| Col. 5, line 64 | After "region", please delete the ".". |

In the Claims:

| | |
|---|---|
| Col. 6, line 50, Claim 2 | Please delete the second occurrence of "gate switch". |
| Col. 6, line 53, Claim 3 | Please delete the second occurrence of "gate switch". |
| Col. 7, line 9, Claim 13 | Please delete "or" and insert --of-- therefor. |

Signed and Sealed this  
Seventeenth Day of February, 2015

Michelle K. Lee  
*Deputy Director of the United States Patent and Trademark Office*